(12) United States Patent
Haetty

(10) Patent No.: US 7,248,102 B2
(45) Date of Patent: Jul. 24, 2007

(54) INTERNAL REFERENCE VOLTAGE GENERATION FOR INTEGRATED CIRCUIT TESTING

(75) Inventor: Jens Haetty, Essex Junction, VT (US)

(73) Assignee: Infineon Technologies AG, Munich (DE)

( * ) Notice: Subject to any disclaimer, the term of this patent is extended or adjusted under 35 U.S.C. 154(b) by 91 days.

(21) Appl. No.: 11/039,665

(22) Filed: Jan. 20, 2005

(65) Prior Publication Data

US 2006/0164116 A1    Jul. 27, 2006

(51) Int. Cl.
*H02M 1/10* (2006.01)
(52) U.S. Cl. ...................... 327/547; 327/530
(58) Field of Classification Search ............... 327/547, 327/407, 408, 409–413, 530
See application file for complete search history.

(56) References Cited

U.S. PATENT DOCUMENTS

| | | | | |
|---|---|---|---|---|
| 5,396,113 | A * | 3/1995 | Park et al. | 327/543 |
| 5,557,232 | A * | 9/1996 | Shimogawa | 327/545 |
| 5,856,756 | A * | 1/1999 | Sasahara et al. | 327/540 |
| 5,909,142 | A * | 6/1999 | Kawasaki et al. | 327/543 |
| 5,929,696 | A * | 7/1999 | Lim et al. | 327/541 |
| 5,942,809 | A * | 8/1999 | Hashimoto | 307/43 |
| 6,078,210 | A * | 6/2000 | Uchida et al. | 327/530 |
| 6,339,357 | B1 * | 1/2002 | Yamasaki et al. | 327/538 |
| 6,459,649 | B2 | 10/2002 | Krause et al. | 365/230.08 |
| 6,504,394 | B2 | 1/2003 | Ohlhoff | 324/765 |
| 6,657,452 | B2 | 12/2003 | Beer et al. | 324/765 |
| 6,661,728 | B2 * | 12/2003 | Tomita et al. | 365/226 |
| 6,744,271 | B2 | 6/2004 | Baker | 324/763 |
| 6,812,684 | B1 | 11/2004 | Leifhelm et al. | 323/312 |
| 6,812,689 | B2 | 11/2004 | Krause et al. | 324/158.1 |

* cited by examiner

*Primary Examiner*—Timothy P. Callahan
*Assistant Examiner*—Hai L. Nguyen
(74) *Attorney, Agent, or Firm*—Patterson & Sheridan, L.L.P.

(57) ABSTRACT

For one or more disclosed methods, a supply voltage is supplied to an integrated circuit, the integrated circuit is placed in a test mode to select one of a plurality of reference voltage generators on the integrated circuit to supply to another voltage generator on the integrated circuit a reference voltage that is at least partially dependent on the supply voltage, and the integrated circuit is tested with the reference voltage supplied to the other voltage generator. One or more disclosed integrated circuits comprise a first voltage generator on the integrated circuit to generate a first voltage that is at least partially dependent on a supply voltage powering the integrated circuit, a second voltage generator on the integrated circuit to generate a second voltage, a third voltage generator on the integrated circuit to generate one or more internal voltages based on a reference voltage, and control circuitry to select the first voltage for use as the reference voltage in a test mode and to select the second voltage for use as the reference voltage in a non-test mode.

25 Claims, 5 Drawing Sheets

INTERNAL REFERENCE VOLTAGE GENERATION FOR INTEGRATED CIRCUIT TESTING

BACKGROUND

1. Field of the Invention

The invention generally relates to integrated circuit testing.

2. Description of the Related Art

FIG. 1 illustrates a prior art integrated circuit 101 on a wafer 100. Integrated circuit 101 comprises a band gap reference (BGR) voltage generator 110, a switch 112, a supply and control voltage generator 140, memory control circuitry and one or more memory arrays 150, control circuitry 130, test circuitry 160, and adjustment circuitry 170.

BGR voltage generator 110 generates a substantially temperature independent BGR voltage from which supply and control voltage generator 140 generates supply and control voltages for memory control circuitry and memory array(s) 150. Because the BGR voltage generated by BGR voltage generator 110 may vary from its desired target value due to, for example, manufacturing tolerances, a tester 180 is used to test integrated circuit 101 using an externally forced BGR voltage. This externally forced BGR voltage may be varied over a range that includes the range of variations expected in the BGR voltage produced by the generator 110. By testing the integrated circuit device over this range (e.g., by writing and reading known test data patterns to the memory array(s) 150, some assurance may be gained that the integrated circuit 101 will operate properly over the expected range of voltages produced internally by the generator 110.

Tester 180 tests integrated circuit 101 in accordance with a flow diagram 200 of FIG. 2. Tester 180 for block 202 supplies a supply voltage $V_{DD}$ through an external $V_{DD}$ pad 103 and supplies a ground supply voltage $V_{SS}$ through an external $V_{SS}$ pad 104 to power integrated circuit 101. Tester 180 for block 204 supplies control signals to control circuitry 130 through one or more external control pads, such as pads 106 and 107 for example, to place integrated circuit 101 in a test mode in which control circuitry 130 activates switch 112 to couple an external $V_{BGR}$ pad 109 to BGR voltage generator 110. Tester 180 for block 206 then forces a BGR voltage substantially at a desired target value onto integrated circuit 101 through external $V_{BGR}$ pad 109 and for block 208 tests integrated circuit 101 using the externally forced BGR voltage.

Tester 180 controls control circuitry 130 to control test circuitry 160 to test memory control circuitry and memory array(s) 150 using the externally forced BGR voltage, for example, as known data patterns are written to the arrays 150 and read back to verify operation of the integrated circuit 101 at the forced BGR voltage. In some cases, the BGR voltage generator 110 may be adjusted (during or after additional testing) by adjustment circuitry 170 to trim the internally generated BGR voltage (e.g., by setting of one or more fuses).

In testing integrated circuits on a wafer, it is generally desirable to have a high degree of parallelism, that is the use of the same tester resources for multiple integrated circuits on the wafer. The number of tester channels that have to be connected to each integrated circuit under test, however, limits the degree of parallelism that can be achieved. Unfortunately, the need to supply an externally forced BGR voltage requires a separate tester channel for each integrated circuit under test.

SUMMARY

One or more disclosed methods for testing an integrated circuit comprise supplying the integrated circuit with a supply voltage, placing the integrated circuit in a test mode to select one of a plurality of reference voltage generators on the integrated circuit to supply to another voltage generator on the integrated circuit a reference voltage that is at least partially dependent on the supply voltage, and testing the integrated circuit with the reference voltage supplied to the other voltage generator.

One or more disclosed integrated circuits comprise a first voltage generator on the integrated circuit to generate a first voltage that is at least partially dependent on a supply voltage powering the integrated circuit, a second voltage generator on the integrated circuit to generate a second voltage, a third voltage generator on the integrated circuit to generate one or more internal voltages based on a reference voltage, and control circuitry to select the first voltage for use as the reference voltage in a test mode and to select the second voltage for use as the reference voltage in a non-test mode.

One or more disclosed systems comprise a wafer having integrated circuits one or more of which have a first voltage generator to generate a first voltage that is at least partially dependent on a supply voltage, a second voltage generator to generate a second voltage, a third voltage generator to generate one or more internal voltages based on a reference voltage, and control circuitry to select the first voltage for use as the reference voltage in a test mode and to select the second voltage for use as the reference voltage in a non-test mode. One or more disclosed systems also comprise a tester to supply one or more integrated circuits with the supply voltage, to place one or more integrated circuits in a test mode, and to test one or more integrated circuits with the first voltage used as the reference voltage.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention generally provide testing of an integrated circuit using an internally generated reference voltage to help avoid the need to use a separate tester channel that provides an externally forced reference voltage. In this manner, the degree of parallelism with which integrated circuits on a wafer may be tested for one or more embodiments may be increased. Alternatively, the freed tester channel for one or more embodiments may be used for another purpose.

Figure 1:
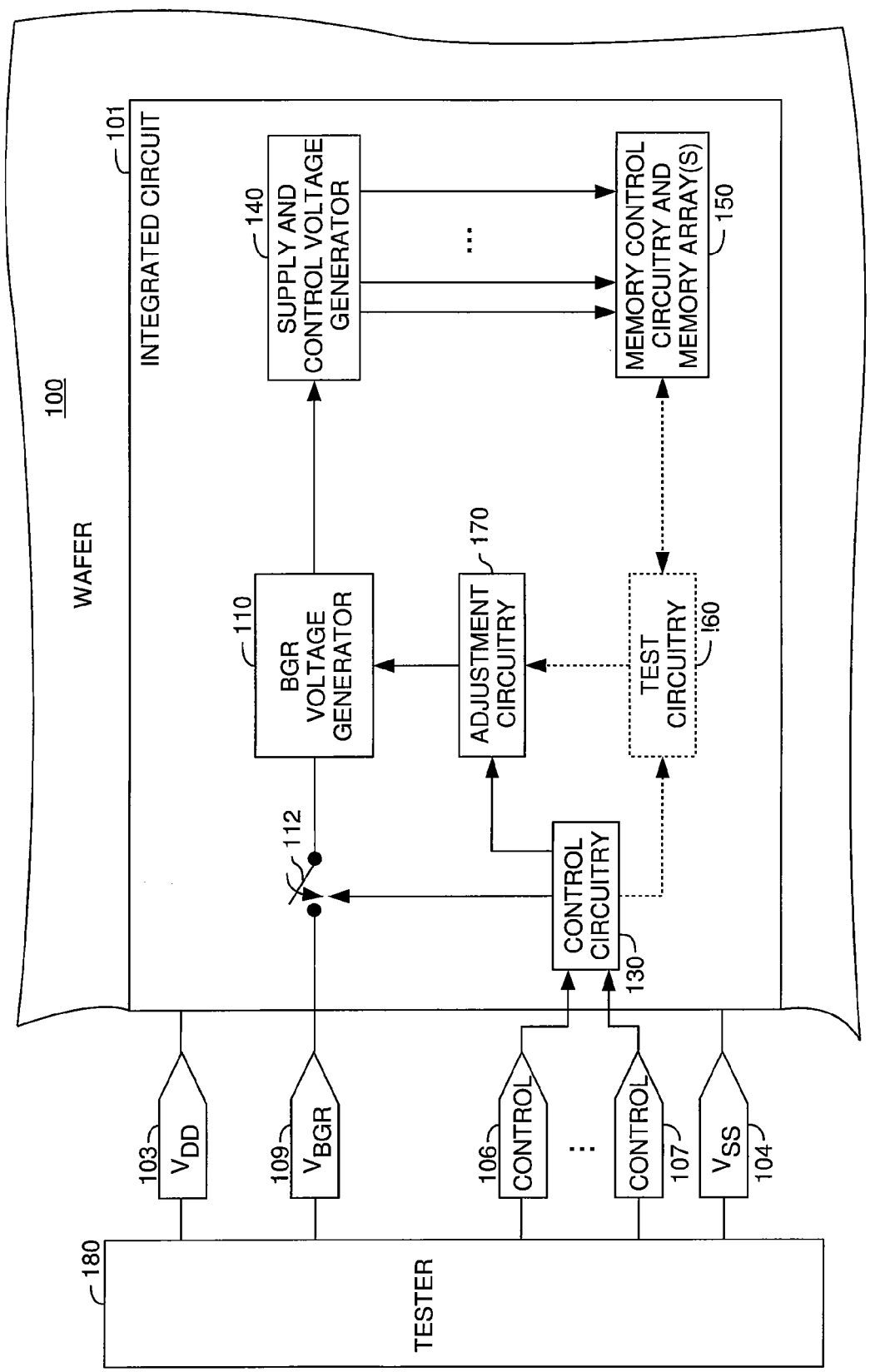
FIG. 1 illustrates a prior art integrated circuit that uses an externally forced reference voltage for testing.
Figure 2:
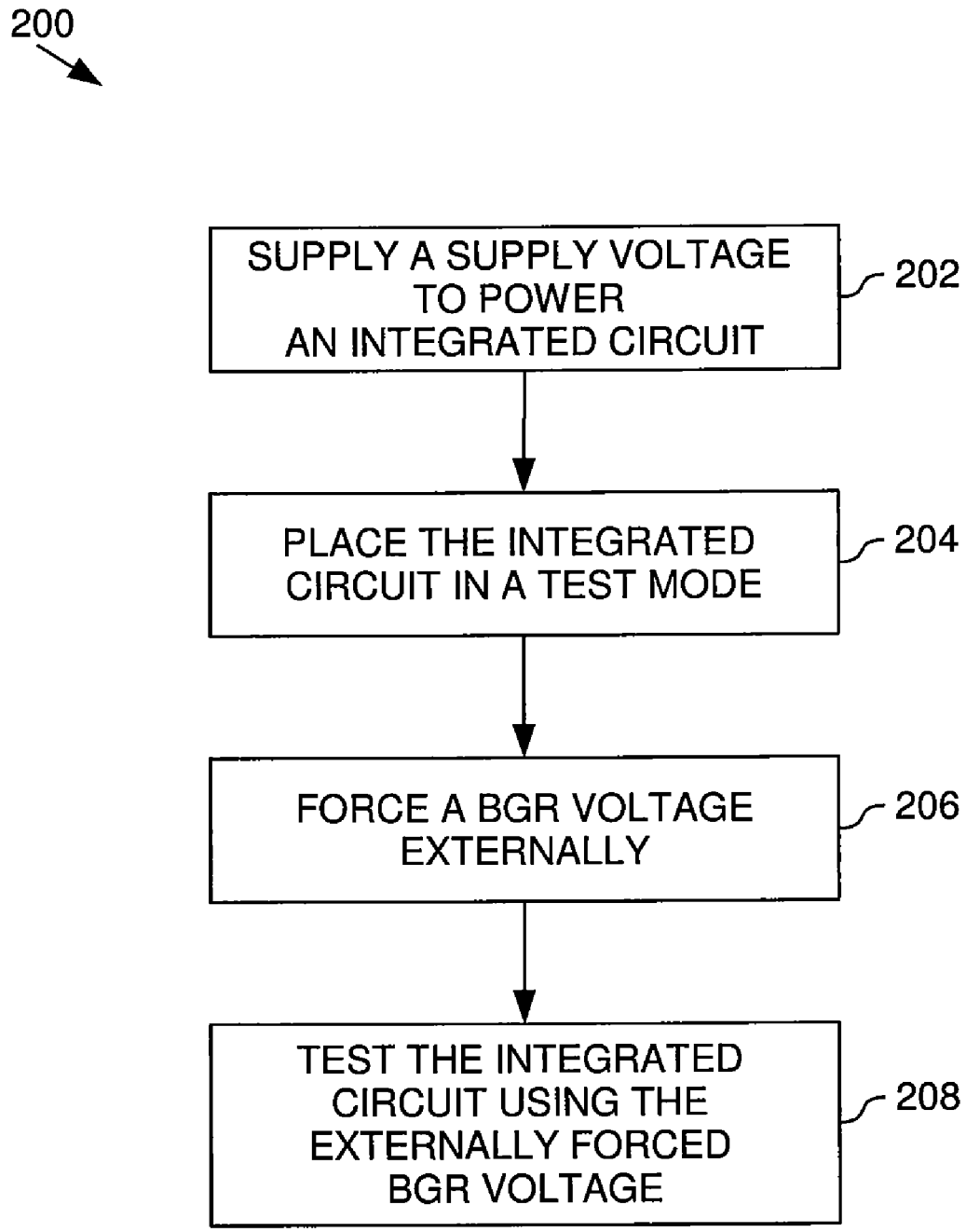
FIG. 2 illustrates a prior art flow diagram for testing an integrated circuit using an externally forced reference voltage.
Figure 3:
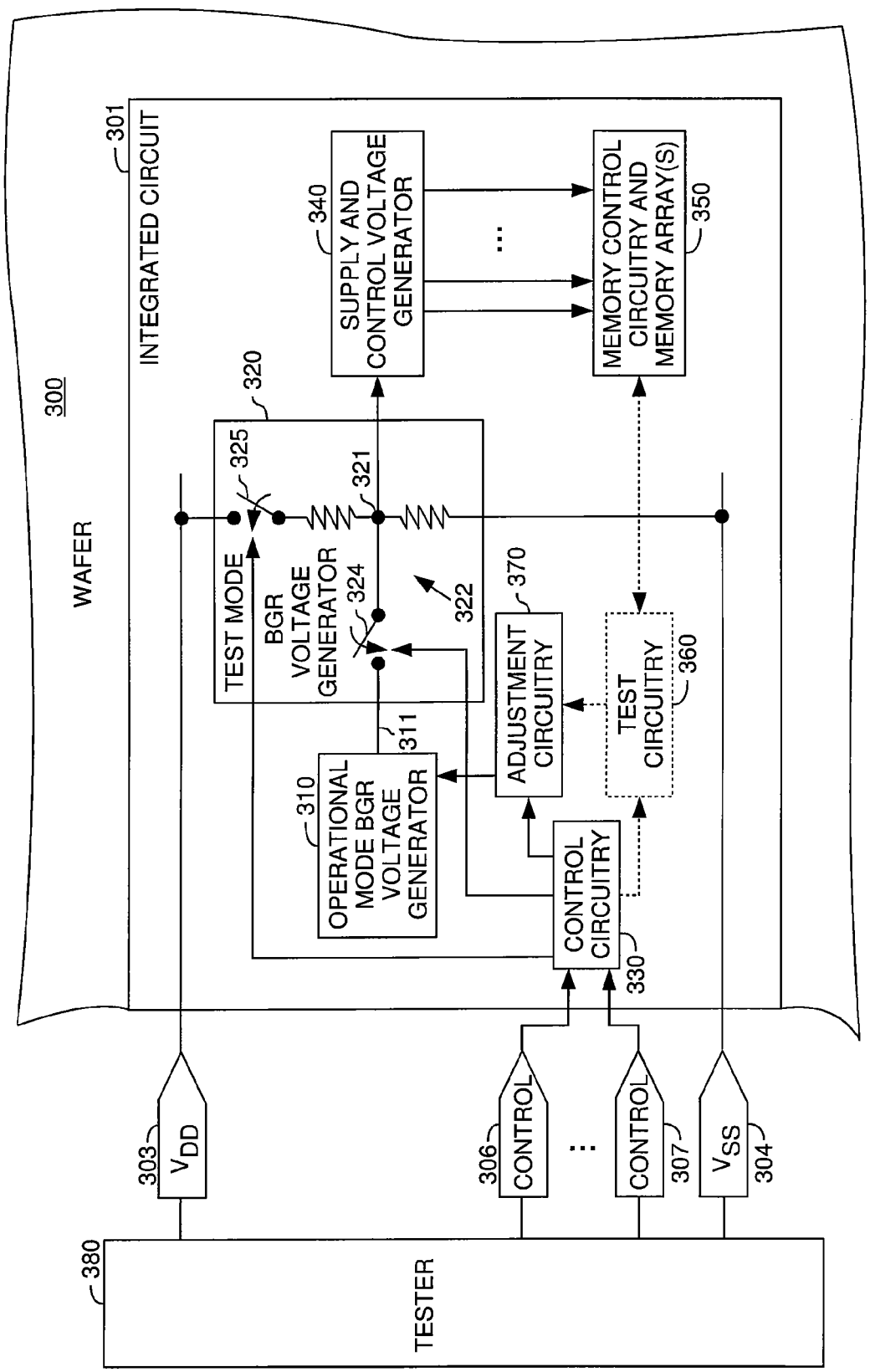
FIG. 3 illustrates, for one or more embodiments, an example integrated circuit having an internal reference voltage generator for testing.

FIG. 3 illustrates an integrated circuit 301 on a wafer 300. Integrated circuit 301 comprises an operational mode band gap reference (BGR) voltage generator 310 to generate a BGR voltage for use by integrated circuit 301 in an operational mode, a test mode BGR voltage generator 320 to generate a BGR voltage for use by integrated circuit 301 in a test mode, and control circuitry 330 to help set integrated circuit 301 into the operational mode or test mode. Although described as an operational mode BGR voltage generator 310, operational mode BGR voltage generator 310 for one or more embodiments may be used in any suitable non-test mode.

Integrated circuit 301 for one or more embodiments, as illustrated in FIG. 3, may also comprise a supply and control voltage generator 340 and memory control circuitry and memory array(s) 350. Operational mode BGR voltage generator 310 may be coupled to supply a BGR voltage to supply and control voltage generator 340 when integrated circuit 301 is in an operational mode, and test mode BGR voltage generator 320 may be coupled to supply a BGR voltage to supply and control voltage generator 340 when integrated circuit 301 is in a test mode. Supply and control voltage generator 340 for one or more embodiments may generate for memory control circuitry and memory array(s) 350 any suitable one or more internal supply voltages and/or any suitable one or more internal control voltages, including one or more internal reference voltages for example, based on the supplied BGR voltage. Although described as comprising supply and control voltage generator 340 to generate internal voltages based on a BGR voltage for memory control circuitry and memory array(s) 350, integrated circuit 301 for one or more embodiments may comprise any suitable one or more voltage generators to generate for any suitable circuitry any suitable one or more internal voltages based on a supplied BGR voltage.

Operational mode BGR voltage generator 310 may comprise any suitable circuitry to generate a BGR voltage. Operational mode BGR voltage generator 310 for one or more embodiments may be substantially temperature independent. That is, operational mode BGR voltage generator 310 may generate a substantially constant BGR voltage with relatively minimal deviation from a desired target value despite fluctuations within a temperature operating range. Operational mode BGR voltage generator 310 for one or more embodiments may be substantially supply voltage independent. That is, operational mode BGR voltage generator 310 may generate a substantially constant BGR voltage with relatively minimized deviation from a desired target value despite fluctuations within an operating range of a supply voltage supplied to power integrated circuit 301.

Because the BGR voltage generated by operational mode BGR voltage generator 310 may vary from its desired target value due to, for example, manufacturing tolerances, integrated circuit 301 for one or more embodiments may use test mode BGR voltage generator 320 to generate a BGR voltage substantially at a desired target value in testing integrated circuit 301 to help identify how to adjust operational mode BGR voltage generator 310. Integrated circuit 301 for one or more embodiments, as illustrated in FIG. 3, may comprise test circuitry 360 to test integrated circuit 301. Integrated circuit 301 for one or more embodiments, as illustrated in FIG. 3, may comprise adjustment circuitry 370 to adjust operational mode BGR voltage generator 310.

Test Mode BGR Voltage Generator

Test mode BGR voltage generator 320 for one or more embodiments may generate a BGR voltage that is at least partially dependent on a supply voltage supplied to power integrated circuit 301. The supply voltage for one or more embodiments may be adjusted to help set the value of the BGR voltage generated by test mode BGR voltage generator 320.

Test mode BGR voltage generator 320 may comprise any suitable circuitry. Test mode BGR voltage generator 320 for one or more embodiments, as illustrated in FIG. 3, may comprise a voltage divider 322 coupled between a first supply voltage node, such as an external $V_{DD}$ pad 303 for example, and a second supply voltage node, such as an external $V_{SS}$ pad 304 for example. By controlling the voltages at the first and second supply voltage nodes and the temperature at which integrated circuit 301 is tested, voltage divider 322 may be used to generate a BGR voltage substantially at a desired target value at a BGR voltage node 321.

Voltage divider 322 may be designed to generate any suitable BGR voltage based on the voltage difference between the first and second supply voltage nodes and may be implemented using any suitable circuit components. For one or more embodiments where the BGR voltage generated by operational mode BGR voltage generator 310 depends on the device parametric of relatively more circuit components than the BGR voltage generated by test mode BGR voltage generator 320, test mode BGR voltage generator 320 may be designed to generate a BGR voltage with a smaller distribution relative to that of operational mode BGR voltage generator 310. Because the BGR voltage generated by voltage divider 322 is dependent on the voltages at the first and second supply voltage nodes, the voltage at the first and/or second supply voltage node may be varied to help set the BGR voltage substantially at one or more desired target values for testing.

Test mode BGR voltage generator 320 for one or more embodiments, as illustrated in FIG. 3, may comprise a switch 324 coupled between a BGR voltage node 311 at which operational mode BGR voltage generator 310 generates a BGR voltage and BGR voltage node 321 and may comprise a switch 325 coupled between the first supply voltage node and voltage divider 322. Control circuitry 330 for one or more embodiments may be coupled to activate switch 324 and deactivate switch 325 when integrated circuit 301 is placed in an operational mode to supply a BGR voltage from operational mode BGR voltage generator 310 to supply and control voltage generator 340. Control circuitry 330 for one or more embodiments may be coupled to deactivate switch 324 and activate switch 325 when integrated circuit 301 is placed in a test mode to supply a BGR voltage from test mode BGR voltage generator 320 to supply and control voltage generator 340. Switches 324 and 325 may be implemented using any suitable circuit components. Switch 325 for one or more embodiments may form a part of voltage divider 322.

Test mode BGR voltage generator 320 for one or more embodiments may comprise any suitable circuitry to help provide a variable BGR voltage based on a given supply voltage supplied to power integrated circuit 301. In this manner, test mode BGR voltage generator 320 for one or more embodiments may be used to test integrated circuit 301 using different BGR voltages to help anticipate variations in the BGR voltage generated by operational mode BGR voltage generator 310 after it has been adjusted and/or to help anticipate extreme BGR voltage conditions. Test mode BGR voltage generator 320 for one or more embodiments may comprise a variable voltage divider.

Figure 4:
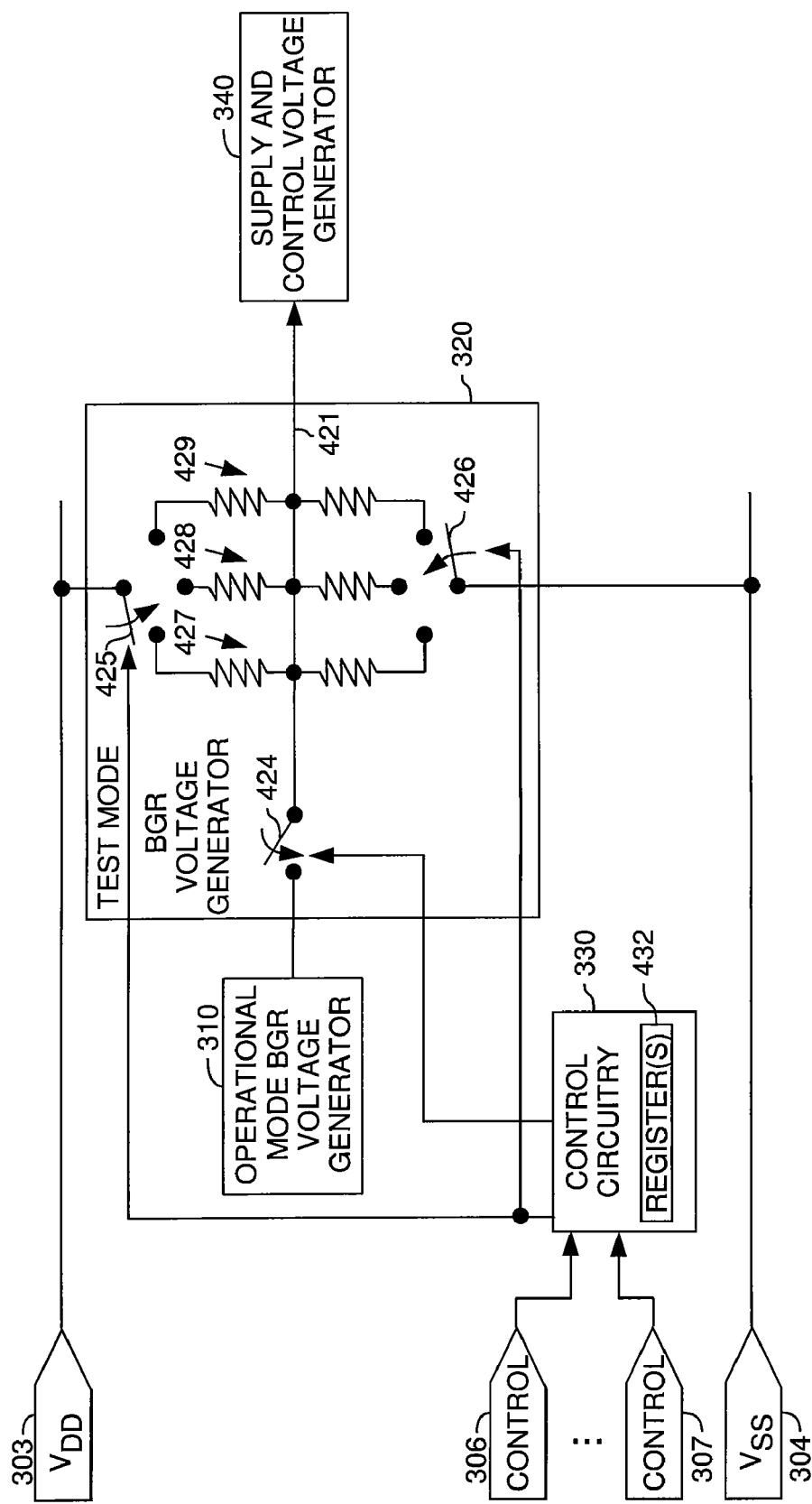
FIG. 4 illustrates, for one or more embodiments, circuitry for an internal reference voltage generator to generate a reference voltage for testing.

As one example, as illustrated in FIG. 4, test mode BGR voltage generator 320 may comprise a plurality of voltage dividers 427, 428, and 429 that may be selectively coupled between a first supply voltage node, such as external $V_{DD}$ pad 303 for example, and a second supply voltage node, such as external $V_{SS}$ pad 304 for example. The plurality of voltage dividers 427, 428, and 429 have different output voltages. By controlling the voltages at the first and second supply voltage nodes and the temperature at which integrated circuit 301 is tested and by selecting one of the plurality of voltage dividers 427, 428, or 429, test mode BGR voltage generator 320 may be used to generate a BGR voltage substantially at a desired one of a plurality of target values at a BGR voltage node 421. Voltage dividers 427, 428, and 429 may be designed to generate any suitable BGR voltage based on the voltage difference between the first and second supply voltage nodes and may be implemented using any suitable circuit components. Because the BGR voltage generated by a selected voltage divider 427, 428, or 429 is dependent on the voltages at the first and second supply voltage nodes, the voltage at the first and/or second supply voltage node may be varied to help set the BGR voltage substantially at one or more desired target values for testing.

Test mode BGR voltage generator 320 may comprise any suitable circuitry to select one of the plurality of voltage dividers 427, 428, and 429. Test mode BGR voltage generator 320 for one or more embodiments, as illustrated in FIG. 4, may comprise a switch 424 coupled between BGR voltage node 311 and BGR voltage node 421, a switch 425 coupled between the first supply voltage node and each voltage divider 427, 428, and 429, and a switch 426 coupled between the second supply voltage node and each voltage divider 427, 428, and 429. Control circuitry 330 for one or more embodiments may be coupled to activate switch 424 and deactivate switches 425 and 426 when integrated circuit 301 is placed in an operational mode to supply a BGR voltage from operational mode BGR voltage generator 310 to supply and control voltage generator 340. Control circuitry 330 for one or more embodiments may be coupled to deactivate switch 424 and activate switches 425 and 426 to select one of the voltage dividers 427, 428, and 429 when integrated circuit 301 is placed in a test mode to supply a BGR voltage from test mode BGR voltage generator 320 to supply and control voltage generator 340. Control circuitry 330 for one or more embodiments may comprise one or more programmable registers 432 that may be set to control switches 424, 425, and/or 426. Switches 424, 425, and 426 may be implemented using any suitable circuit components. Switches 425 and/or 426 for one or more embodiments may form a part of voltage dividers 427, 428, and/or 429.

IC Testing Using Test Mode BGR Voltage Generator

Integrated circuit 301 may be tested in any suitable manner using a BGR voltage generated by test mode BGR voltage generator 320 to help identify how to adjust operational mode BGR voltage generator 310. Integrated circuit 301 for one or more embodiments may be tested using a tester 380, as illustrated in FIG. 3, in accordance with a flow diagram 500 of FIG. 5.

Figure 5:
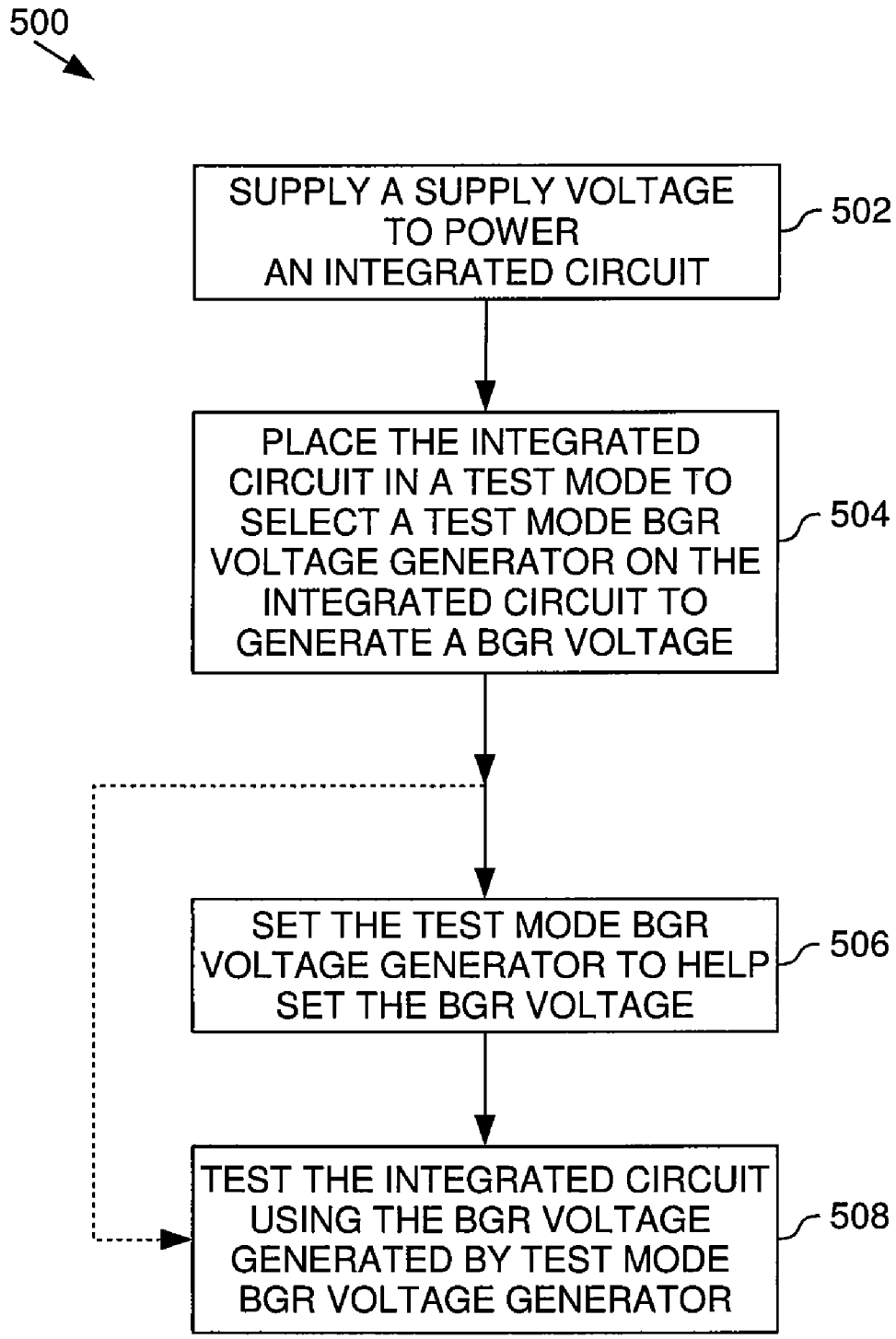
FIG. 5 illustrates, for one or more embodiments, a flow diagram for testing an integrated circuit having an internal reference voltage generator.

For block 502 of FIG. 5, tester 380 supplies a supply voltage to power integrated circuit 301. Tester 380 for one or more embodiments may supply a supply voltage $V_{DD}$ through at least external $V_{DD}$ pad 303 and supply a reference supply voltage $V_{SS}$, such as a ground supply voltage for example, through at least external $V_{SS}$ pad 304 to power integrated circuit 301.

For block 504, tester 380 places integrated circuit 301 in a test mode to select test mode BGR voltage generator 320 to generate a BGR voltage for integrated circuit 301. Tester 380 for one or more embodiments may supply control signals to control circuitry 330 through one or more external control pads, such as pads 306 and 307 for example, to place integrated circuit 301 in a test mode to select test mode BGR voltage generator 320 to supply supply and control voltage generator 340 a BGR voltage that is at least partially dependent on the supply voltage $V_{DD}$ and/or the supply voltage $V_{SS}$. Tester 380 may supply any suitable control signals through any suitable one or more external control pads to place integrated circuit 301 in a test mode in any suitable manner. Tester 380 for one or more embodiments may optionally adjust the supply voltage $V_{DD}$ and/or the supply voltage $V_{SS}$ to help set the BGR voltage substantially at a desired target value.

For block 506, tester 380 may optionally set test mode BGR voltage generator 320 to help set the BGR voltage. Where test mode BGR voltage generator 320 comprises a plurality of voltage dividers 427, 428, and 429 as illustrated in FIG. 4, tester 380 for one or more embodiments may select one of voltage dividers 427, 428, and 429 to generate a BGR voltage substantially at a desired target value.

Tester 380 for one or more embodiments may set test mode BGR voltage generator 320 to coarsely set the BGR voltage near a desired target value and adjust the supply voltage $V_{DD}$ and/or the supply voltage $V_{SS}$ to more finely tune the BGR voltage substantially at the desired target value.

For block 508, tester 380 tests integrated circuit 301 using the BGR voltage generated by test mode BGR voltage generator 320. Tester 380 for one or more embodiments may control control circuitry 330 to control test circuitry 360 to test memory control circuitry and memory array(s) 350 using the BGR voltage supplied by test mode BGR voltage generator 320. During this testing, data patterns may be written to and read from the array(s) 350. The data patterns read from the array(s) 350 may be compared to data patterns written to the array(s) 350 to verify the integrated circuit 301 works properly over the entire expected range of internally generated BGR voltages.

In some cases (during or after additional testing), operational mode BGR voltage generator 310 may be adjusted by adjustment circuitry 370. For example, tester 380 for one or more embodiments may control control circuitry 330 to control adjustment circuitry 370 to adjust operational mode BGR voltage generator 310. For one or more embodiments, test circuitry 360 may be coupled to control adjustment circuitry 370 to adjust operational mode BGR voltage generator 310 (e.g., by setting of one or more fuses).

In any case, after testing, integrated circuit 301 may then be placed in an operational mode to select operational mode BGR voltage generator 310 to supply a BGR voltage to supply and control voltage generator 340. For one or more embodiments, tester 380 may supply control signals to control circuitry 330 through one or more external control pads, such as pads 306 and 307 for example, to place integrated circuit 301 in an operational mode. Integrated circuit 301 for one or more embodiments may also comprise any suitable circuitry to place integrated circuit 301 in an operational mode automatically after being powered up and/or reset.

Although described in connection with testing integrated circuit 301, tester 380 for one or more embodiments may test a plurality of integrated circuits on wafer 300 in accordance with flow diagram 500 of FIG. 5. Because tester 380 may therefore test integrated circuits on wafer 300 without using a tester channel that provides an externally forced reference voltage, the degree of parallelism with which integrated circuits on wafer 300 may be tested for one or more embodiments may be increased. Alternatively, the freed tester channel for one or more embodiments may be used for another purpose.

CONCLUSION

Embodiments of the invention generally providing testing of an integrated circuit using an internally generated reference voltage to help avoid using a tester channel that provides an externally forced reference voltage have therefore been described. While the foregoing is directed to such embodiments, other and further embodiments of the invention may be devised without departing from the basic scope thereof, and the scope thereof is determined by the claims that follow.

What is claimed is:

1. An integrated circuit, comprising:
a first voltage generator on the integrated circuit to generate a first voltage that is adjustable based on a supply voltage powering the integrated circuit, wherein the first voltage generator comprises a variable voltage divider which provides a selectable output voltage as the first voltage;
a second voltage generator on the integrated circuit to generate a second voltage;
a third voltage generator on the integrated circuit to generate one or more internal voltages based on a reference voltage; and
control circuitry to select the first voltage for use as the reference voltage in a test mode and to select the second voltage for use as the reference voltage in a non-test mode.

2. The integrated circuit of claim 1, wherein the second voltage generator generates a second voltage that is substantially temperature independent.

3. The integrated circuit of claim 1, wherein the second voltage generator generates a second voltage that is substantially constant over an operating range of the supply voltage.

4. The integrated circuit of claim 1, further comprising:
memory circuitry,
wherein the third voltage generator generates one or more internal voltages for the memory circuitry based on the reference voltage.

5. The integrated circuit of claim 1, further comprising:
adjustment circuitry to adjust the second voltage generator to provide the second voltage in a desired range.

6. A memory device, comprising:
memory circuitry;
a first voltage generator on the integrated circuit to generate a first voltage that is adjustable based on a supply voltage powering the integrated circuit, wherein the first voltage generator comprises a plurality of voltage dividers having different output voltages which are selectable to be output as the first voltage;
a second voltage generator on the integrated circuit to generate a second voltage;
a third voltage generator on the integrated circuit to generate, based on a reference voltage, one or more internal voltages to be supplied to the memory circuitry; and
control circuitry to select the first voltage as the reference voltage in a test mode and to select the second voltage as the reference voltage in a non-test mode.

7. The integrated circuit of claim 6, wherein the second voltage generator generates a second voltage that is substantially constant over an operating range of the supply voltage.

8. The integrated circuit of claim 6, wherein the control circuitry comprises one or more registers to select one of the plurality of voltage dividers to generate the first voltage.

9. The integrated circuit of claim 6, wherein the second voltage generator generates a second voltage that is substantially temperature independent.

10. An integrated circuit, comprising:
means for generating one or more internal voltages based on a reference voltage;
means for generating a first voltage adjustable based on a supply voltage powering the integrated circuit, wherein the first voltage is selected as the reference voltage when the integrated circuit is in a test mode, and wherein the means for generating the first voltage comprises a variable voltage divider; and
means for generating a second voltage which is selected as the reference voltage when the integrated circuit is in a non-test mode.

11. The integrated circuit of claim 10, further comprising:
means for adjusting the second voltage to provide the second voltage in a desired range.

12. A system, comprising:
a wafer having integrated circuits, wherein one or more of which have a first voltage generator to generate a first voltage that is adjustable based on a supply voltage, a second voltage generator to generate a second voltage, a third voltage generator to generate one or more internal voltages based on a reference voltage, and control circuitry to select the first voltage as the reference voltage in a test mode and to select the second voltage as the reference voltage in a non-test mode; and
a tester to supply one or more integrated circuits with the supply voltage, to place one or more integrated circuits in the test mode, and to test one or more integrated circuits with the first voltage selected as the reference voltage, wherein the first voltage generator comprises a variable voltage divider, and wherein the tester sets the variable voltage divider of the first voltage generator to set the first voltage.

13. The system of claim 12, wherein the tester adjusts the supply voltage to help set the first voltage.

14. The system of claim 12, wherein the first voltage generator comprises one or more voltage dividers, and wherein the tester selects an output from one of the one or more voltage dividers as the first voltage.

15. The system of claim 12, wherein one or more integrated circuits have memory circuitry and wherein the third voltage generator generates one or more internal voltages for the memory circuitry based on the reference voltage.

16. The system of claim 12, wherein one or more integrated circuits have adjustment circuitry to adjust the second voltage generator to provide the second voltage in a desired range.

17. A method for testing an integrated circuit, comprising:
supplying the integrated circuit with a supply voltage;
placing the integrated circuit in a test mode to select one of a plurality of reference voltage generators on the integrated circuit to supply to an internal voltage generator on the integrated circuit a reference voltage that is adjustable based on the supply voltage;
setting the selected reference voltage generator to set the reference voltage; and
testing the integrated circuit with the reference voltage supplied to the internal voltage generator.

18. The method of claim 17, further comprising:
adjusting the supply voltage to set the reference voltage.

19. The method of claim 17, wherein
the selected reference voltage generator comprises a variable voltage divider to set the reference voltage.

20. The method of claim 17, further comprising:
adjusting a non-selected one of the reference voltage generators in response to the testing.

21. The method of claim 17, further comprising:
placing the integrated circuit in an operational mode to select a substantially temperature independent one of the plurality of reference voltage generators on the integrated circuit to supply the reference voltage to the internal voltage generator on the integrated circuit.

22. A method for testing an integrated circuit, comprising:
supplying the integrated circuit with a supply voltage;
placing the integrated circuit in a test mode;
selecting one of a plurality of reference voltage generators on the integrated circuit to supply to an internal voltage generator on the integrated circuit a reference voltage that is adjustable based on the supply voltage, wherein the selected reference voltage generator comprises a plurality of voltage dividers coupled to the supply voltage;
selecting one of a plurality of voltage dividers to generate the reference voltage; and
testing the integrated circuit with the reference voltage supplied to the internal voltage generator.

23. The method of claim 22, further comprising:
adjusting the supply voltage to set the reference voltage.

24. The method of claim 22, further comprising:
adjusting a non-selected one of the reference voltage generators in response to the testing, wherein the reference voltage generated by the adjusted non-selected one of the reference voltage generators is adjusted to a desired range.

25. The method of claim 22, further comprising:
placing the integrated circuit in an operational mode to select a substantially temperature independent one of the plurality of reference voltage generators on the integrated circuit to supply the reference voltage to the internal voltage generator on the integrated circuit.

* * * * *